(12) United States Patent
Baca et al.

(10) Patent No.: US 11,069,425 B2
(45) Date of Patent: Jul. 20, 2021

(54) MULTI-LEVEL MEMORY REPURPOSING TECHNOLOGY TO PROCESS A REQUEST TO MODIFY A CONFIGURATION OF A PERSISTENT STORAGE MEDIA

(71) Applicant: Intel Corporation, Santa Clara, CA (US)

(72) Inventors: Jim S. Baca, Corrales, NM (US); Joseph Tarango, Longmont, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/107,155

(22) Filed: Aug. 21, 2018

(65) Prior Publication Data
US 2019/0043604 A1 Feb. 7, 2019

(51) Int. Cl.
G06F 3/06 (2006.01)
G11C 29/00 (2006.01)
G11C 29/52 (2006.01)
G06F 11/34 (2006.01)
G06F 12/02 (2006.01)
G11C 29/44 (2006.01)

(52) U.S. Cl.
CPC ............. *G11C 29/70* (2013.01); *G06F 3/061* (2013.01); *G06F 3/064* (2013.01); *G06F 3/0607* (2013.01); *G06F 3/0614* (2013.01); *G06F 3/0634* (2013.01); *G06F 3/0647* (2013.01); *G06F 3/0679* (2013.01); *G06F 11/3409* (2013.01); *G11C 29/52* (2013.01); *G11C 29/72* (2013.01); *G11C 29/808* (2013.01); *G11C 29/883* (2013.01); *G06F 12/0246* (2013.01); *G11C 29/44* (2013.01)

(58) Field of Classification Search
CPC ......... G11C 29/70; G11C 29/52; G11C 29/72; G11C 29/883; G11C 29/808; G11C 29/44; G06F 3/0647; G06F 3/0607; G06F 3/0634; G06F 3/064; G06F 3/0614; G06F 3/061; G06F 11/3409; G06F 3/0679; G06F 12/0246; G06F 11/3034
See application file for complete search history.

(56) References Cited

U.S. PATENT DOCUMENTS

| | | | |
|---|---|---|---|
| 6,940,163 B2 | 9/2005 | Piorun et al. | |
| 9,477,587 B2* | 10/2016 | Wong | ................... G06F 12/0207 |
| 2009/0037654 A1* | 2/2009 | Allison | ................... G06F 21/79 |
| | | | 711/112 |
| 2010/0082890 A1* | 4/2010 | Heo | ................... G06F 12/0246 |
| | | | 711/103 |
| 2011/0099460 A1* | 4/2011 | Dusija | ................. G11C 11/5621 |
| | | | 714/773 |
| 2012/0240012 A1* | 9/2012 | Weathers | ................ G11C 29/44 |
| | | | 714/773 |
| 2012/0246391 A1* | 9/2012 | Meir | ................... G06F 12/0246 |
| | | | 711/103 |
| 2013/0138870 A1* | 5/2013 | Yoon | ................... G11C 16/3495 |
| | | | 711/103 |

(Continued)

*Primary Examiner* — Mushfique Siddique
(74) *Attorney, Agent, or Firm* — Jordan IP Law, LLC

(57) ABSTRACT

An embodiment of a semiconductor apparatus may include technology to receive a request to modify a configuration of a persistent storage media, and repurpose a region of the persistent storage media from a first number of bits per cell to a second number of bits per cell in response to the request. Other embodiments are disclosed and claimed.

20 Claims, 10 Drawing Sheets

(56) References Cited

U.S. PATENT DOCUMENTS

| | | | |
|---|---|---|---|
| 2013/0173844 A1* | 7/2013 | Chen | G06F 12/0246 |
| | | | 711/103 |
| 2014/0059406 A1* | 2/2014 | Hyun | G11C 11/5621 |
| | | | 714/773 |
| 2016/0284393 A1* | 9/2016 | Ramalingam | G11C 11/5628 |
| 2016/0299722 A1* | 10/2016 | Seo | G06F 3/0665 |
| 2017/0220269 A1* | 8/2017 | Kankani | G06F 3/0616 |
| 2019/0042385 A1* | 2/2019 | Casmira | G06F 11/3419 |

* cited by examiner

MULTI-LEVEL MEMORY REPURPOSING TECHNOLOGY TO PROCESS A REQUEST TO MODIFY A CONFIGURATION OF A PERSISTENT STORAGE MEDIA

TECHNICAL FIELD

Embodiments generally relate to memory and storage systems. More particularly, embodiments relate to multi-level memory repurposing.

BACKGROUND

A multi-level non-volatile memory stores more than one bit per cell. Multi-level NAND memory having four (4) possible voltage levels per cell may be referred to as multi-level cell (MLC) memory and may represent two (2) bits of data per cell. NAND memory having eight (8) voltage levels per cell may be referred to as triple-level cell (TLC) memory and may represent three (3) bits of data per cell. NAND memory having sixteen (16) voltage levels per cell may be referred to as quad-level cell (QLC) memory and may represent four (4) bits of data per cell.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Various embodiments described herein may include a memory component and/or an interface to a memory component. Such memory components may include volatile and/or nonvolatile memory (NVM). Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

NVM may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

Figure 1:
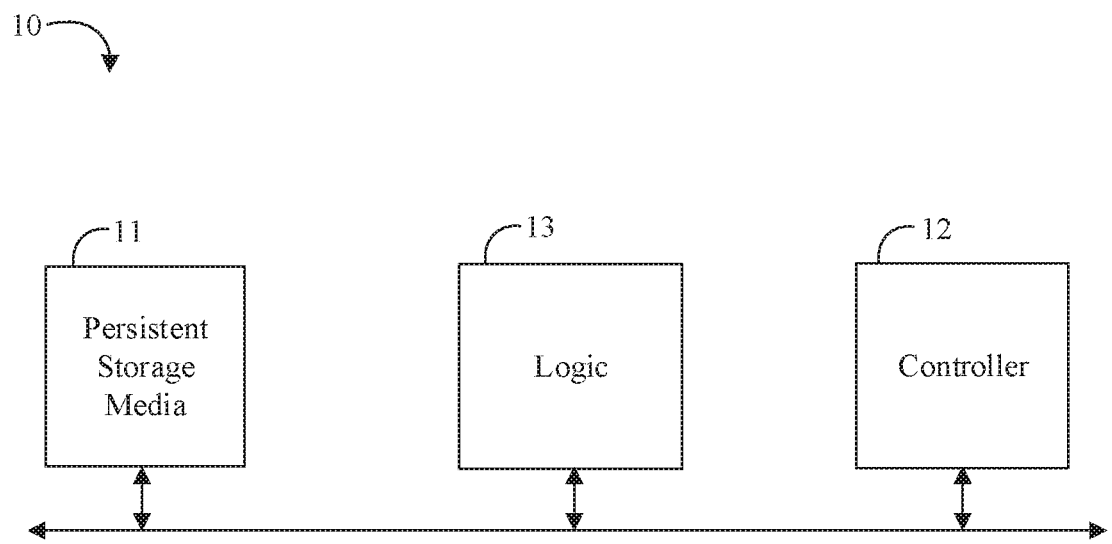
FIG. 1 is a block diagram of an example of storage system according to an embodiment.

Turning now to FIG. 1, an embodiment of a storage system 10 may include persistent storage media 11 including multiple bits per cell, a controller 12 communicatively coupled to the persistent storage media 11, and logic 13 communicatively coupled to the controller 12 and the persistent storage media 11 to receive a request to modify a configuration of the persistent storage media 11, and repurpose a region of the persistent storage media 11 from a first number of bits per cell to a second number of bits per cell in response to the request. In some embodiments, the logic 13 may be further configured to change a configuration of the region of the persistent storage media 11 from a higher number of bits per cell to a lower number of bits per cell. Additionally, or alternatively, the logic 13 may be configured to identify a defective region of the persistent storage media 11, and switch a sense mode for the defective region to contain less bits per cell. For example, the logic 13 may be configured to determine if the defective region is non-defective with the switched sense mode, and repurpose the defective region as an available region if the defective region is determined to be non-defective with the switched sense mode. In some embodiments, the logic 13 may be further configured to evaluate blocks of the persistent storage media 11 to identify blocks near cell failure, pool one or more sets of blocks identified to be near cell failure based on the number of bits per cell, and repurpose the region of persistent storage media 11 after a set of blocks has pooled a threshold number of blocks. For example, the logic 13 may also be configured to provide estimated performance capability information, wherein the estimated performance capability information may relate to one or more performance capabilities as would be understood to one of ordinary skill in the art. In such an example, the logic 13 may also be configured to provide estimated performance capability information based on the evaluation to identify blocks near cell failure to a host. In such an example, the logic 13 may also be configured to repurpose the region of persistent storage media 11 based on information received from the host in response to the provided estimated performance capability information. In any of the embodiments herein, the persistent storage media 11 may include a solid state drive (SSD). In some embodiments, the logic 13 may be located in, or co-located with, various components, including the controller 12 (e.g., on a same die).

Embodiments of each of the above persistent storage media 11, controller 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 12 may include a general purpose controller, a special purpose controller, a memory controller, a storage controller, a storage manager, a processor, a central processor unit (CPU), a micro-controller, etc.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the persistent storage media 11, or other system memory may store a set of instructions which when executed by the controller 12 cause the system 10 to implement one or more components, features, or aspects of the system 10 (e.g., the logic 13, receiving the request to modify the configuration of the persistent storage media, repurposing the region of the persistent storage media in response to the request, etc.).

Figure 2:
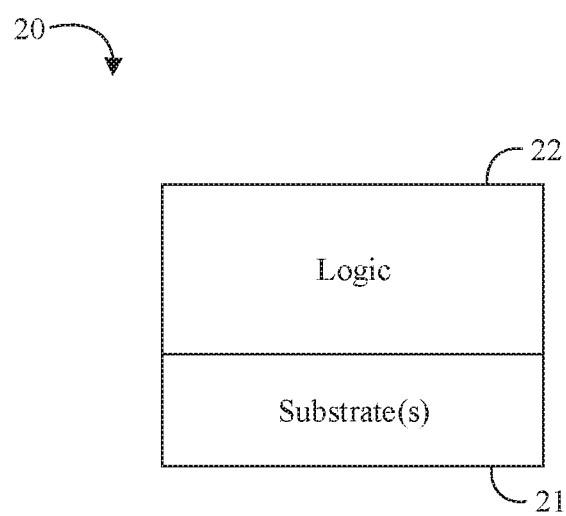
FIG. 2 is a block diagram of an example of a semiconductor apparatus according to an embodiment.

Turning now to FIG. 2, an embodiment of a semiconductor apparatus 20 may include one or more substrates 21, and logic 22 coupled to the one or more substrates 21, wherein the logic 22 is at least partly implemented in one or more of configurable logic and fixed-functionality hardware logic. The logic 22 coupled to the one or more substrates 21 may be configured to receive a request to modify a configuration of a persistent storage media, and repurpose a region of the persistent storage media from a first number of bits per cell to a second number of bits per cell in response to the request.

In some embodiments, the logic 22 may be further configured to change a configuration of the region of the persistent storage media from a higher number of bits per cell to a lower number of bits per cell. Additionally, or alternatively, the logic 22 may be configured to identify a defective region of the persistent storage media, and switch a sense mode for the defective region to contain less bits per cell. For example, the logic 22 may be configured to determine if the defective region is non-defective with the switched sense mode, and repurpose the defective region as an available region if the defective region is determined to be non-defective with the switched sense mode. In some embodiments, the logic 22 may be further configured to evaluate blocks of the persistent storage media to identify blocks near cell failure, pool one or more sets of blocks identified to be near cell failure based on the number of bits per cell, and repurpose the region of persistent storage media after a set of blocks has pooled a threshold number of blocks. For example, the logic 22 may also be configured to provide estimated performance capability information based on the evaluation to a host, and repurpose the region of persistent storage media based on information received from the host in response to the provided estimated performance capability information. In any of the embodiments herein, the persistent storage media may include a SSD. In some embodiments, the logic 22 coupled to the one or more substrates 21 may include transistor channel regions that are positioned within the one or more substrates 21.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

The apparatus 20 may implement one or more aspects of the method 30 (FIGS. 3A to 3C), or any of the embodiments discussed herein. In some embodiments, the illustrated apparatus 20 may include the one or more substrates 21 (e.g., silicon, sapphire, gallium arsenide) and the logic 22 (e.g., transistor array and other integrated circuit/IC components) coupled to the substrate(s) 21. The logic 22 may be implemented at least partly in configurable logic or fixed-functionality logic hardware. In one example, the logic 22 may include transistor channel regions that are positioned (e.g., embedded) within the substrate(s) 21. Thus, the interface between the logic 22 and the substrate(s) 21 may not be an abrupt junction. The logic 22 may also be considered to include an epitaxial layer that is grown on an initial wafer of the substrate(s) 21.

Figure 3A:
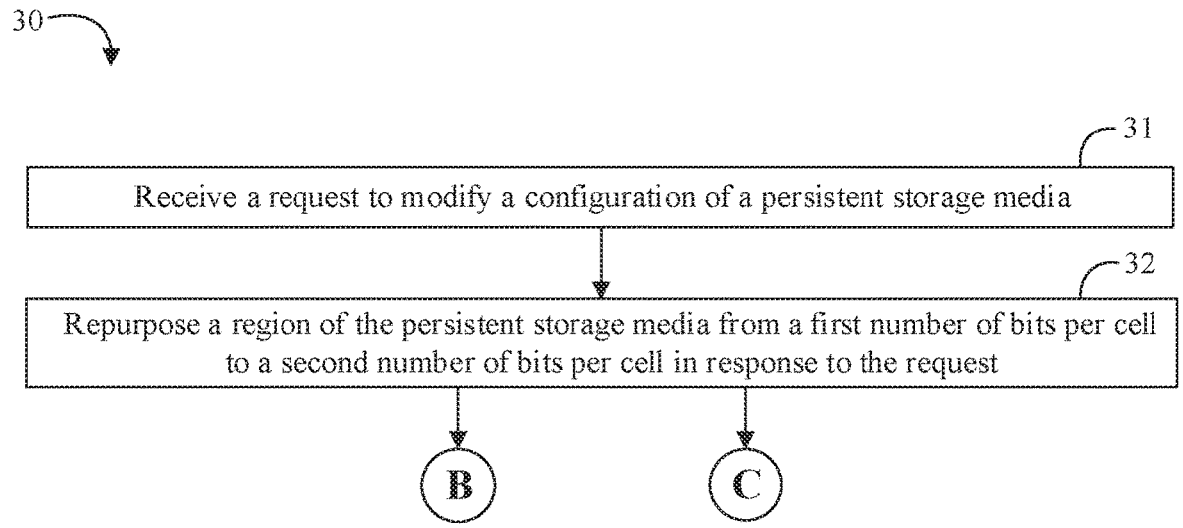
FIGS. 3A to 3C are flowcharts of an example of a method of managing storage according to an embodiment.
Figure 3B:
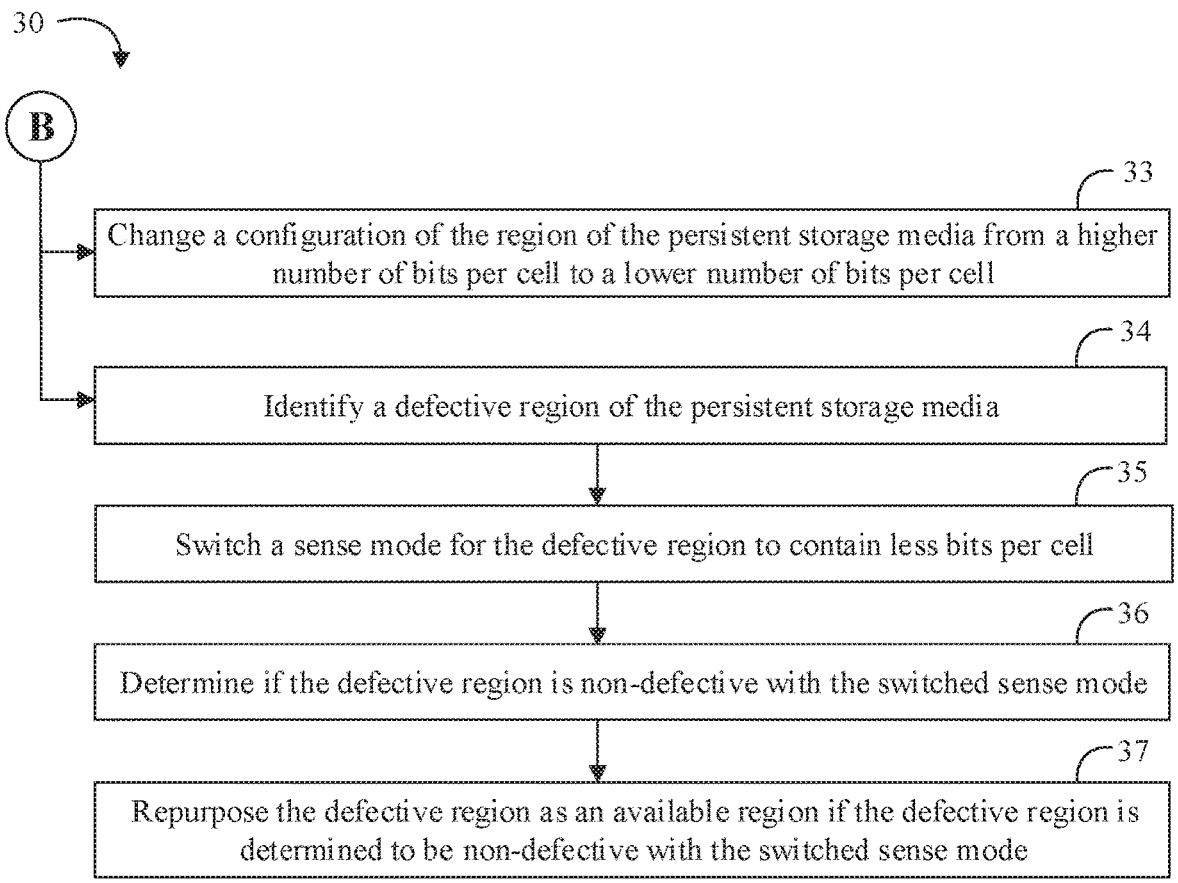
Figure 3C:
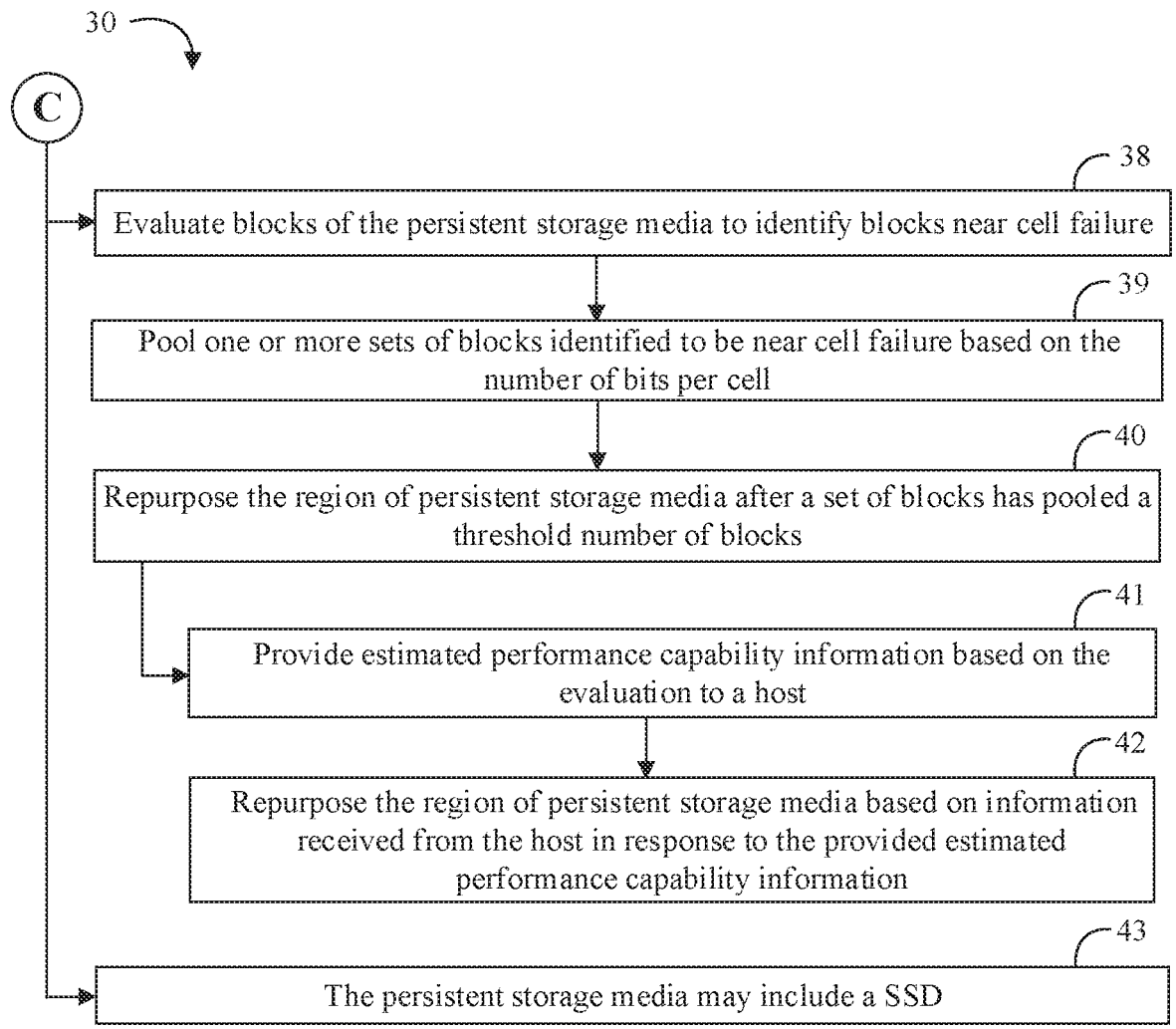

Turning now to FIGS. 3A to 3C, an embodiment of a method 30 of managing storage may include receiving a request to modify a configuration of a persistent storage media at block 31, and repurposing a region of the persistent storage media from a first number of bits per cell to a second number of bits per cell in response to the request at block 32. Some embodiments of the method 30 may further include changing a configuration of the region of the persistent storage media from a higher number of bits per cell to a lower number of bits per cell at block 33. Additionally, or alternatively, some embodiments of the method 30 may include identifying a defective region of the persistent storage media at block 34, and switching a sense mode for the defective region to contain less bits per cell at block 35. For example, the method 30 may further include determining if the defective region is non-defective with the switched sense mode at block 36, and repurposing the defective region as an available region if the defective region is determined to be non-defective with the switched sense mode at block 37. Some embodiments of the method 30 may further include evaluating blocks of the persistent storage media to identify blocks near cell failure at block 38, pooling one or more sets of blocks identified to be near cell failure based on the number of bits per cell at block 39, and repurposing the region of persistent storage media after a set of blocks has pooled a threshold number of blocks at block 40. For example, the method 30 may further include providing estimated performance capability information based on the evaluation to a host at block 41, and repurposing the region of persistent storage media based on information received from the host in response to the provided estimated performance capability information at block 42. In any of the embodiments herein, the persistent storage media may include a SSD at block 43.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 30 may be implemented on a computer readable medium as described in connection with Examples 23 to 29 below. Embodiments or portions of the method 30 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide technology for just-in-time (JIT) memory block repurposing in solid state drives (SSDs) for extended life and/or increased performance (e.g., at the cost of user space). For example, such repurposing may be useful to reclaim blocks of multi-level memory cells which previously were identified as non-defective, but which may no longer meet performance or reliability requirements at a higher level (e.g., became defective at the higher level for whatever reason). Some embodiments may advantageously evaluate such defective blocks to determine if they are able to meet performance or reliability requirements at a lower level and, if so, repurpose the blocks at the lower level such they may be made available for storage utilization.

Another example of a useful application for JIT memory block repurposing may include datacenter applications, cloud services, function as a service (FaaS), etc., where a service provider needs to manage resources to meet workload or customer needs/requirements. As described in more detail below, multi-level memory technology provides some trade-offs between storage space, speed, and endurance. By providing the flexibility to dynamically provision storage space for individual SDD devices, some embodiments may advantageously support JIT or on-demand reconfiguration of a storage solution based on current workload, predicted workload, customer requests, etc. For example, a cloud service provider may reconfigure a SSD from higher capacity and slower speeds to lower capacity and higher speeds for a workload that requires higher bandwidth, but not as much storage capacity (e.g., from QLC to TLC, or MLC). Conversely, a cloud service provider may reconfigure the SSD from lower capacity to higher capacity for a workload that requires more storage capacity (e.g., from TLC to QLC).

Figure 4:
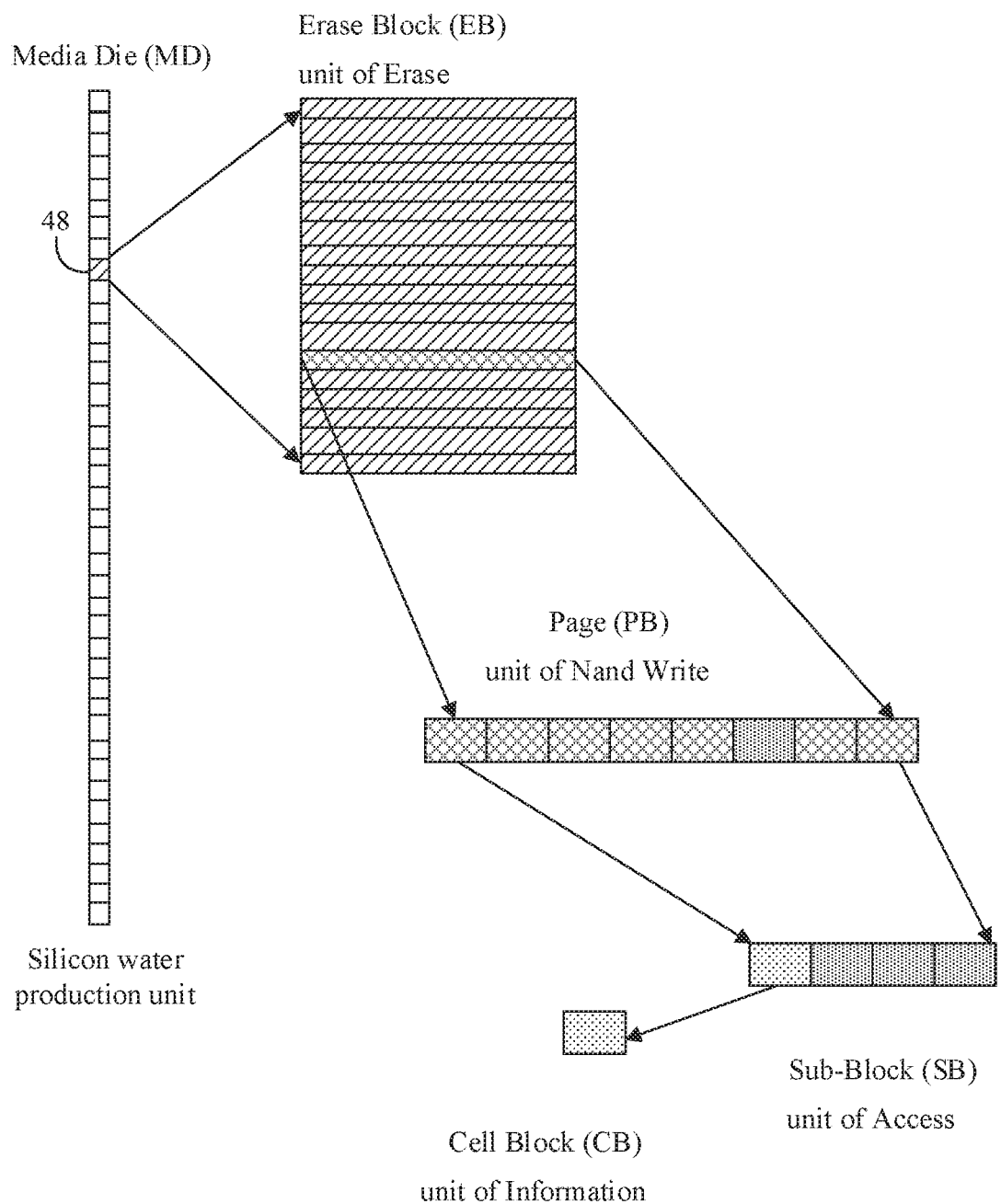
FIG. 4 is an illustrative diagram of an example of persistent storage media according to an embodiment.

Turning now to FIG. 4, an illustrative diagram of a persistent storage media 46 may include storage structure including one or more media die 48. The media die 48 may include storage device technology derived from a silicon wafer (e.g. NAND flash technology). A SSD may include one or more such media die 48 (e.g., more than one die may be packaged into a physical device). Examples of the packaging may include single die package (SDP, one (1) media die per physical device), dual die package (DDP, two (2) media die per physical device), octal die package (ODP, eight (8) media die per physical device), etc. (e.g., to the technology limitation). Each media die 48 may include multiple erase blocks (EBs), which may refer to the smallest element at which a block can be erased. Each EB may include multiple page blocks (PBs), which may refer to the smallest element for programming. Each of the PBs may include a collection of sub-blocks (SBs), which may refer to the smallest read granularity for density purposes. Each SB may include multiple cells or cell blocks (CBs).

As a media technology advances, more information may be packed into the fundamental CBs. For example, a CB may represent anywhere from 1 bit per cell (single level cell (SLC) to N bits per cell. The current N for some technology media set is four (4), such that a tier stepping of 1 (SLC), 2 (MLC), 3 (TLC), and 4 (QLC) may be provided for that media technology. Each of these tiers may also be referred to as programming modes (PM). Table 1 shows example illustrative performance information for each tier:

TABLE 1

|  | SLC | MLC | TLC | QLC |
| --- | --- | --- | --- | --- |
| Erase Cycles | 100,000 | 30,000 | 10,000 | 5,000 |
| Bits Per Cell | 1 | 2 | 3 | 4 |
| Write Speed (µs) | 362 | 1391 | 2087 | 2782 |

TABLE 1-continued

| | SLC | MLC | TLC | QLC |
|---|---|---|---|---|
| Read Speed (μs) | 32-55 | 57-63 | 65-123 | 86-163 |
| Erase Speed (ms) | 15 | 15 | 15 | 15 |

As shown in Table 1, the write and read speeds are reduced between each tier, indicating that operations one mode below may provide better performance. With each tier, the endurance of the cell differs so the decreasing mode will have much more endurance. Conventionally, a SSD is initially characterized/configured to meet device requirements (e.g., multiple types of memory (e.g., some SLC, some QLC, etc.), capacity, etc.) and the initial characterization remains unchanged (e.g., except for removing blocks which later become defective from the available storage capacity). Technologically, however, a CB may support all of the tiers/PMs up to the highest supported by the media (e.g., a QLC cell may support programming modes for SLC, MLC, TLC, and QLC). Some embodiments may advantageously re-characterize the CBs to switch the number of bits-per-block (e.g., to meet a different performance capability requirement, to reclaim defective blocks, etc.).

Due to the inherent imperfections of media, the potential of blocks may be reduced based on a conditional state change. For example, the state changes may occur at the factory, during manufacturing, in the field, etc., and may involve moving a previously good block to a defective block. For example, the state of no ability to use a PB may be referred to as a defective block (DB). The removal of the block decreases the potential user space based on the locality or sparse nature of the defects.

Figure 5:
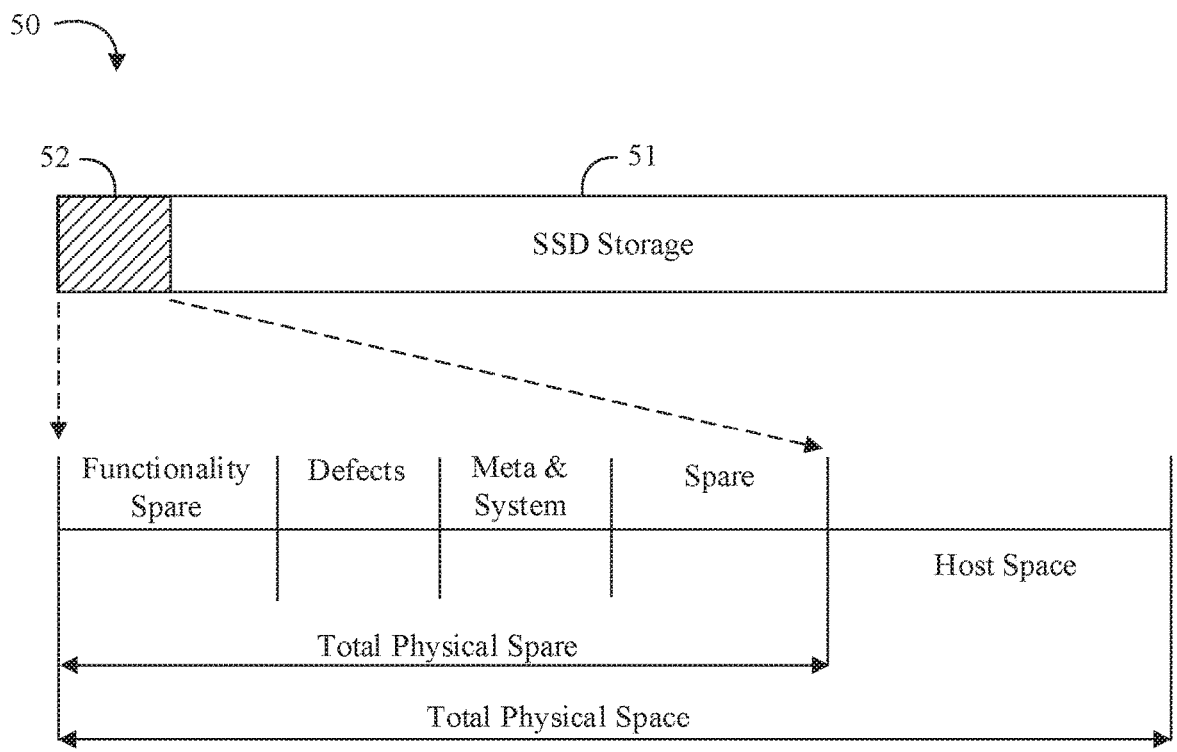
FIG. 5 is an illustrative diagram of an example of SSD storage space allocation according to an embodiment.

Turning now to FIG. 5, an illustrative diagram shows how SSD total physical space may be allocated between host space 51 and spare space 52 (not to scale). From a system perspective the SSD operation may require functionality spare space for run time operations, meta/system space for system details, spare space for write amplification (WA) reduction for garbage collection, and host data space. The WA space may be important to drive endurance. Considerations of drive critical spare space for operation, end of life effective spare, etc., all contribute to an absolute minimum spare space. As the physical spare space is modified, the WA may also be directly affected and change drive endurance based on cycling capability. Increasing the efficacy of writing to the physical spare will decrease the WA, increasing longevity due to the NP-Complete nature of algorithms. The algorithm complexity may be alleviated by adding spare to the total physical spare allowing more endurance. Some embodiments may provide logical re-enablement for repurposed memory blocks and may advantageously introduce system spare that may otherwise have been considered lost.

Figure 6:
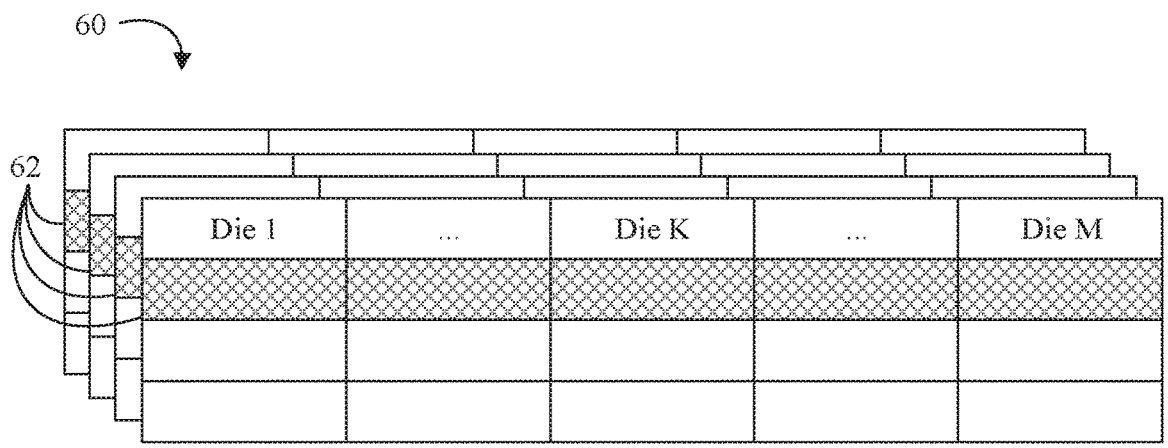
FIG. 6 is an illustrative diagram of another example of persistent storage media according to an embodiment.

Turning now to FIG. 6, an illustrative diagram of a persistent storage media 60 may include multiple media die (e.g., Die 1 . . . Die K . . . Die M) with a storage structure which spans the media die. For example, the granularity of the elements may be of disjoint size so the interaction between the blocks are staged such that the greatest common denomination may correspond to a transitioning set (TS) referred to as a band. For example, a unique feature of a band is that the set consists of concurrent EBs for the media technology to ease meta tracking. To maintain the table, some implementations may use an indirection table to ensure band collections are optimized based on media rules for data integrity. Conventional SSD technology throws away sets of blocks of media as a preventative measure to ensure product performance. Static assignment of blocks out of the factory are mapped to help mitigate low performing sets of blocks. This initial assignment may occur one-time at the factory prior to deploying the SSD in any storage solution or application. As the SSD is used over time, defects may be encountered within the internal memory blocks. Conventional SSDs may retire these blocks, removing system space until the SSD reaches a critical point for drive failure. After the retired memory blocks exceed a threshold amount (e.g., based on a specified product performance requirement), the reduced storage space may impact performance and uniformity consistency. At the failure mode, the SSD may no longer usable at the customer so they are discarded.

In contrast to conventional SSDs, some embodiments may dynamically repurpose memory blocks to reclaim defective blocks (e.g., in the field, after initial deployment). Repurposing the memory blocks may advantageously increase storage capacity (e.g., as compared to retiring the defective block), increase performance (e.g., going from a higher level of bits to a lower level of bits), and increase endurance (e.g., going from a higher level of bits to a lower level of bits). In some embodiments, an SSD with multi-level cell programming capability may ratchet down from higher bits per cell configurations to lower level bits per cell configurations (e.g., from QLC to TLC to MLC to SLC) rather than retiring entire blocks of storage, thereby increasing lifespan (e.g., durability) and performance at the cost of reduction in user space (e.g., from non-defective blocks, but increasing user space as compared to retiring defective blocks). Some embodiments may advantageously provide dynamic speeds in response to host requests for fast, medium, and slow bands (e.g., to satisfy the NVM EXPRESS (NVMe) 1.3 specification (nvmexpress.org)). For example, some embodiments may repurpose broken areas to give more performance, or switch based on event needs. Some embodiments may advantageously provide more adaptable and robust SSDs. Some features/aspects of various embodiments may be built-in to the SSD device itself. Advantageously, some embodiments may be applied to legacy SSD devices with aftermarket technology to repurpose the SSD (e.g., through an interface or external controller). For example, a failed or failing SSD may have its logical capacity resized to address failures. The failure may occur due to a number of reasons including, for example, high defect counts. Advantageously, some embodiments may physically repurpose defective blocks by switching the sensing mode to contain less bits per cell. The switching of the sensing mode will decrease the bit density per cell resulting in lower physical capacity, but may overcome the problem with the block such that the block becomes usable with the new sensing mode. The benefit of switching to a lower bit density is that the sensing can occur faster resulting in faster program and read times with more endurance (e.g., see Table 1).

Figure 7:
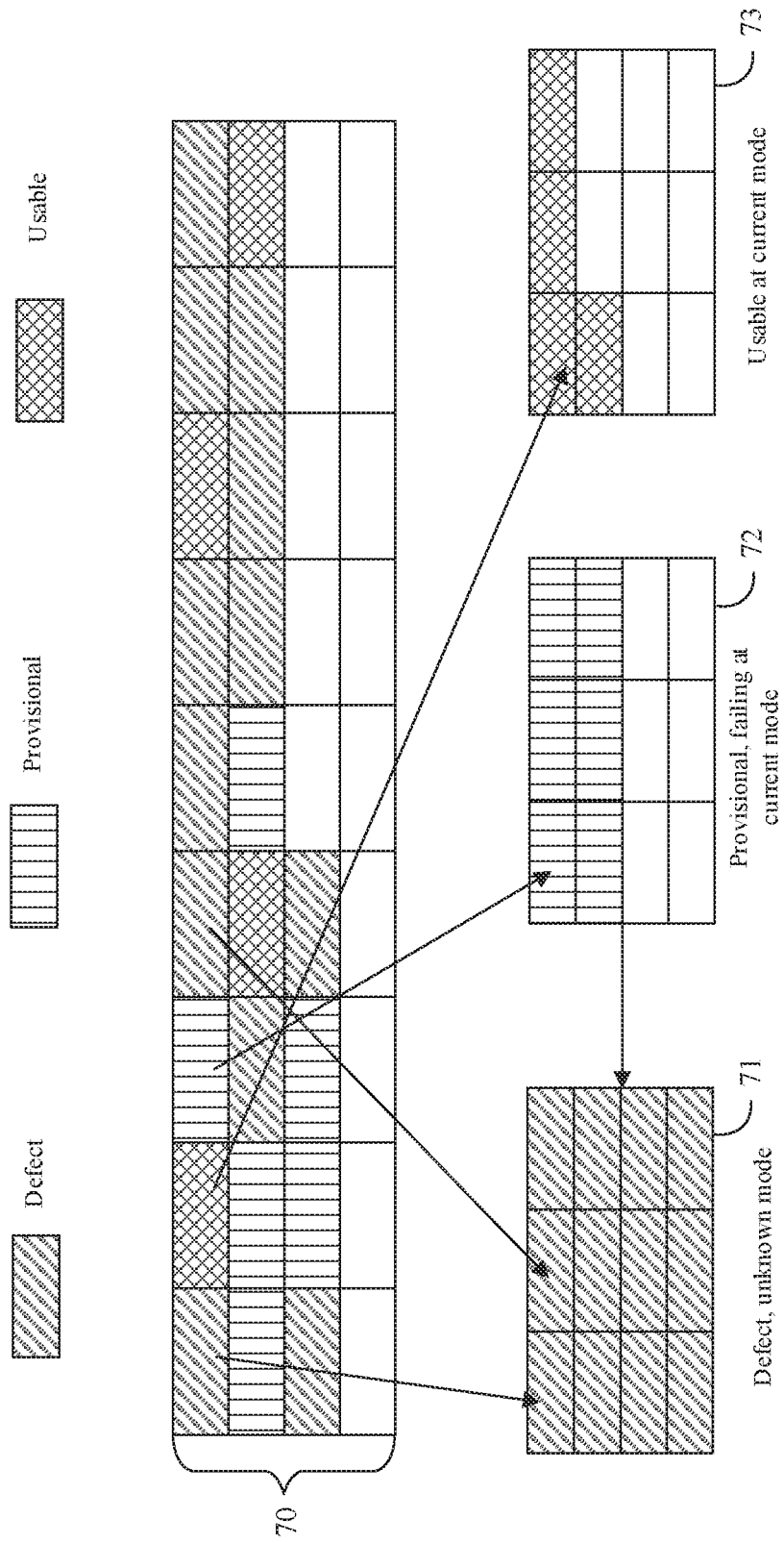
FIG. 7 is an illustrative diagram of another example of persistent storage media according to an embodiment.

Turning now to FIG. 7, an embodiment of a persistent storage media 70 may include multiple EBs. For example, a SSD may allocate a set of erase blocks to meet a product requirement document (PRD) based on one media type. Over time a fraction of these blocks may no longer be operable at their current mode, so they can no longer be used in the system for the desired performance level. Once the unusable blocks reach a threshold, PRD specifications may no longer be met and the entire set of blocks may be retired (e.g., marked as defective). A failing block may not be marked as defective immediately, and may instead be marked as provisional. Some embodiments may track set of defective blocks 71, provisional blocks 72, and usable blocks 73 (e.g., on a per-mode basis). The marking may help support parity protection for the band and may allow an amount of defects for runtime operations. In the event the protection range is exceeded, the current band may be aborted and a next, ready band may be allocated. In some embodiments, the sets of blocks may be based on a logical grouping of one EB per media die for the entire whole set of erase blocks. Advantageously, some embodiments may regroup and repurpose the EBs to form a new set if the set is large enough to meet the PRD.

Figure 8:
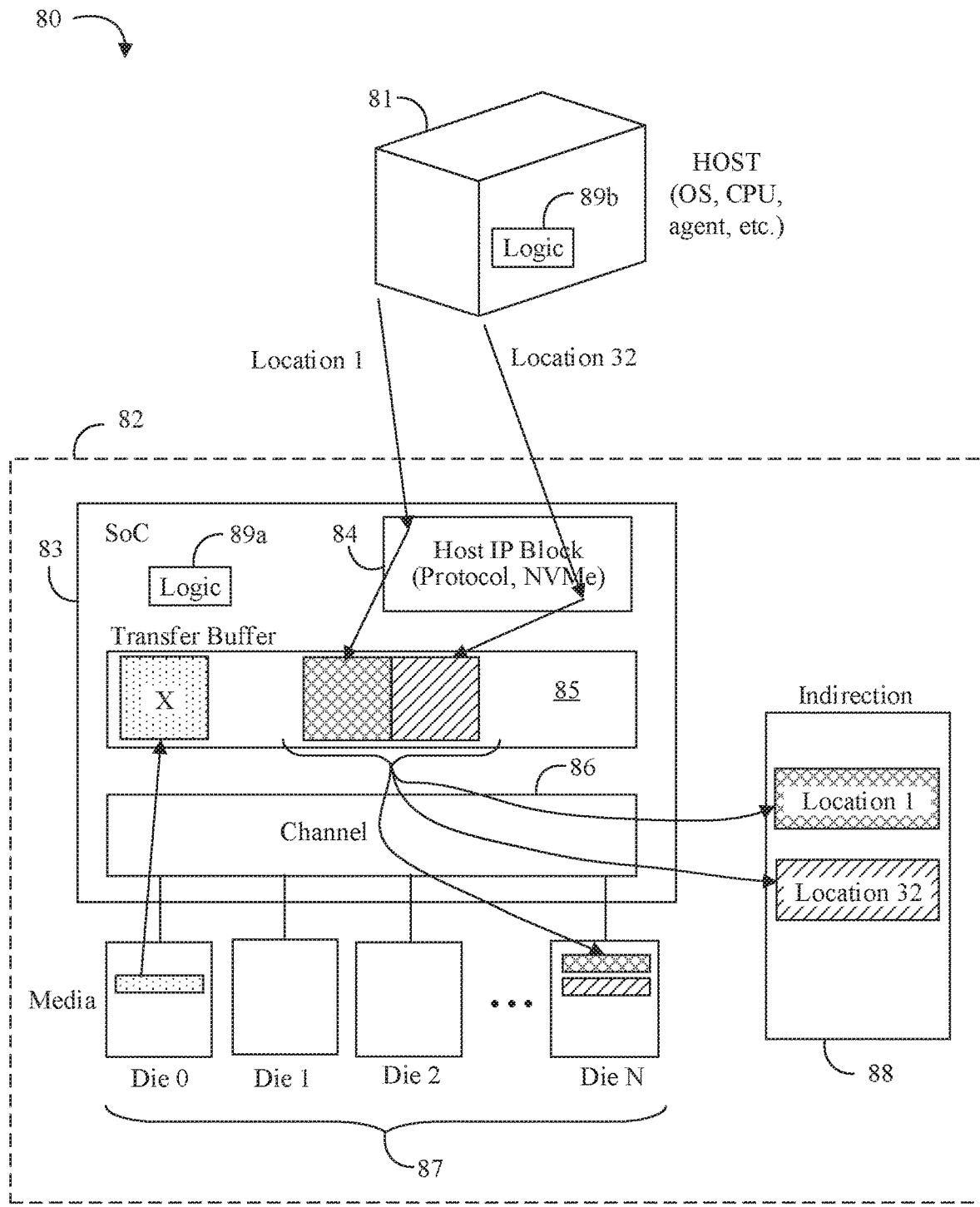
FIG. 8 is a block diagram of an example of an electronic processing system according to an embodiment.

Turning now to FIG. 8, an electronic processing system 80 may include a host 81 (e.g., CPU, OS, agent, etc.) communicatively coupled (e.g., wired or wirelessly) to a storage device 82 (e.g., a SSD). The storage device 82 may include a controller 83 (e.g., which may be implemented on a SoC) which includes a host IP block 84 (e.g., interface, protocol, NVMe, etc.), a transfer buffer 85, and one or more channels 86. The channels 86 may be coupled to persistent storage media 87 (e.g., Die 0 through Die N). A host access request (e.g., directed to Location 1, Location 32, etc.) may go through the transfer buffer 85 to the media 87 based on entries in an indirection table 88. Some transfers X may go directly from the transfer buffer 85 to the media 87 through the channels 86. The transfer buffer 85 may include a persistent and/or non-persistent storage. The level of indirection (e.g., the indirection table 88) may include a multiple level cascading system where host address space is one level, another level may include internal to physical media mapping, and an additional level of media external scope to internal media extra block re-mapping. Each media level may also consist of the similar type to disjoint media technologies to mask the external latency. The host protocol may include any suitable technology including current or future protocols (e.g., NVMe, small computer system interface (SCSI), serial attached SCSI (SAS), serial ATA (SATA), parallel ATA (PATA), etc.).

In accordance with some embodiments, the controller 83 and/or the host 81 may further include logic 89a and 89b to manage the storage device 82. For example, the logic 89a may be configured to receive a request (e.g., from the host 81) to modify a configuration of the media 87, and to repurpose a region of the media 87 from a first number of bits per cell to a second number of bits per cell in response to the request. In some embodiments, the logic 89a may be further configured to change a configuration of the region of the media 87 from a higher number of bits per cell to a lower number of bits per cell (e.g., from QLC to TLC). Additionally, or alternatively, the logic 89a may be configured to identify a defective region of the media 87, and switch a sense mode for the defective region to contain less bits per cell. For example, the logic 89a may be configured to determine if the defective region is non-defective with the switched sense mode, and repurpose the defective region as an available region if the defective region is determined to be non-defective with the switched sense mode. In some embodiments, the logic 89a may be further configured to evaluate blocks of the media 87 to identify blocks near cell failure, pool one or more sets of blocks identified to be near cell failure based on the number of bits per cell, and repurpose the region of media 87 after a set of blocks has pooled a threshold number of blocks. For example, the logic 89a may also be configured to provide estimated performance capability information based on the evaluation to the host 81, and repurpose the region of persistent storage media based on information received from the host 81 in response to the provided estimated performance capability information.

In the event that a set of blocks can no longer be created at the PRD operating mode, the logic 89a may notify the host 81 that the device 82 is approaching failure and will re-enter read only mode (e.g., via a Self-Monitoring, Analysis, and Reporting Technology (SMART) feature command. In the read-only mode, the device 82 may notify the host 81 about the amount of data required for moving the data to another drive to maintain operation. After the data is moved and verified, the host 81 may notify the device 82, and the device 82 may then repurpose a defective region of one or more defective blocks, logically resize the user capacity, and report the expected performance to the host 81. In some embodiments, the logic 89a and/or 89b may be further configured provide a training and learning mode to re-evaluate all blocks, and repurpose blocks as needed/requested (e.g., see the method 90 (FIG. 9)). In the internal mode, several operations may be performed. At the start, all of the defective blocks may be evaluated, where each may be tested for a stable programing mode. Such testing may not need to occur solely at this stage, but at the learning phase the operation may need to be completed if not previously done. The expectation is as defects are promoted each of these blocks in the pool will be evaluated in cycles when a die is not used. Over time, as the critical event approaches, most or all blocks may be marked for a highest level stable programing mode.

Figure 9:
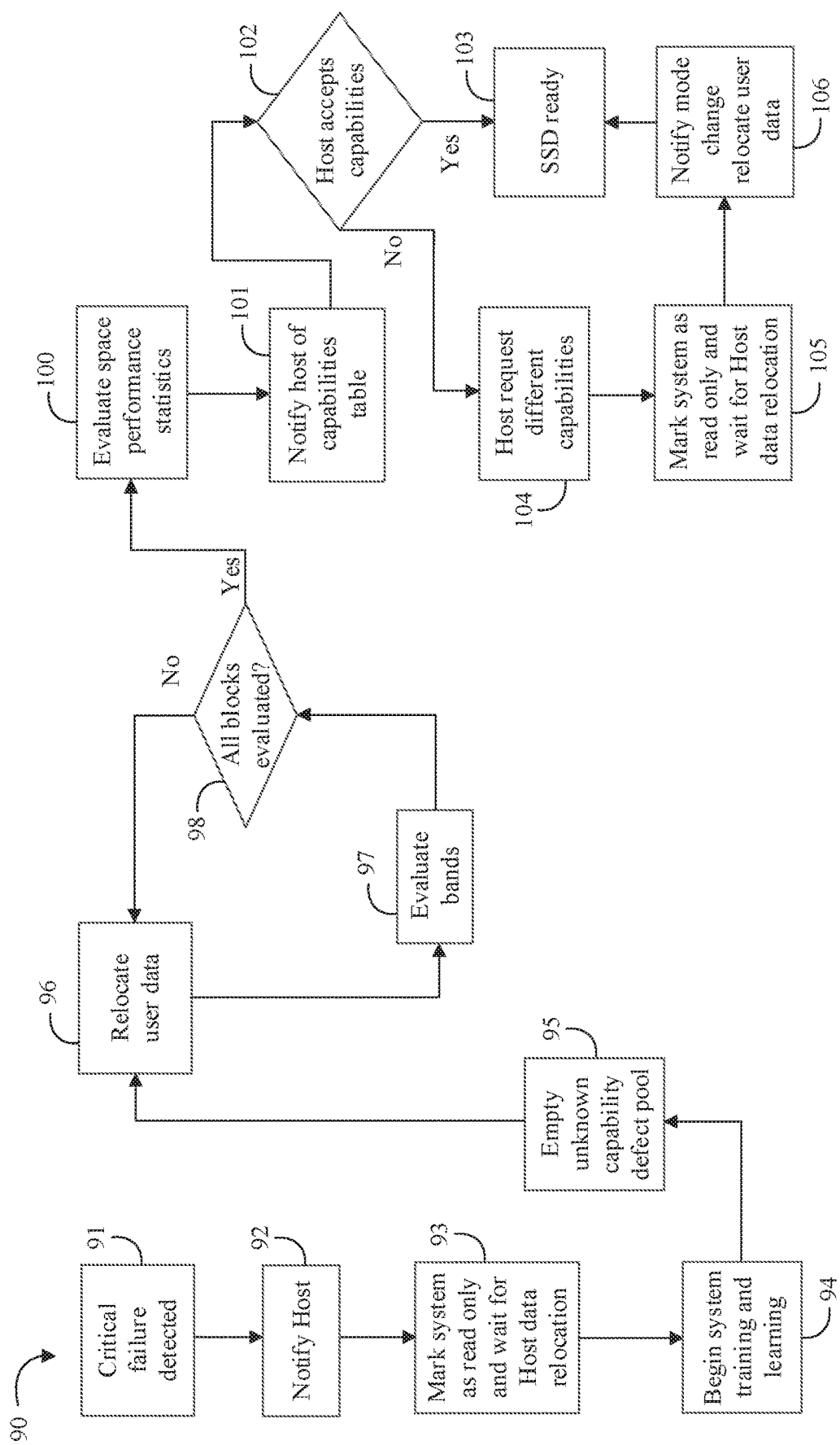
FIG. 9 is a flowchart of another example of a method of managing storage according to an embodiment.

Turning now to FIG. 9, an embodiment of a method 90 of managing storage may include detecting a critical failure at block 91, notifying the host at block 92, and marking the system as read-only and waiting for the host data relocation at block 93. After the host data relocation, the method 90 may include beginning a training and learning mode at block 94, where all blocks can be re-evaluated. An unknown capability defect pool may be emptied at block 95. Next, all user data/content will be marked for relocation at block 96, and the bands may be evaluated during the relocation process at block 97.

In the relocation process, each of the emptied blocks may walk through the possible operating modes to find the next stable operating mode. For example, if the block is near cell failure at the current mode then the block may be marked as the mode below with less bits. These blocks may then be placed into allocation pools for re-logical enablement, based on the number of bits of the programming mode for each block. The logical re-enablement may advantageously introduce system spare that may otherwise have been considered lost.

After all of the blocks are evaluated at block 98, the method 90 may then include evaluating storage space performance statistics at block 100 (e.g., computing the capabilities of performance). For example, the evaluation may be done based on the next lower density mode including a mixed mode at which each band has separate capabilities. The projection calculations may attempt cases based on the initial configuration. In the event the capabilities cannot be met, the method 90 may attempt to do a search for possibilities. The method 90 may then include notifying the host of a capabilities table at block 101 (e.g., including the determined capabilities and the search possibilities). If the host accepts the capabilities at block 102, the storage system may be ready at block 103. Otherwise, the host may request different capabilities at block 104 and the system may be marked as read only and may then wait for host data relocation at block 105. The method 90 may then include notifying the mode change and relocate user data at block 106, after which the storage system may be ready at block 103.

Figure 10:
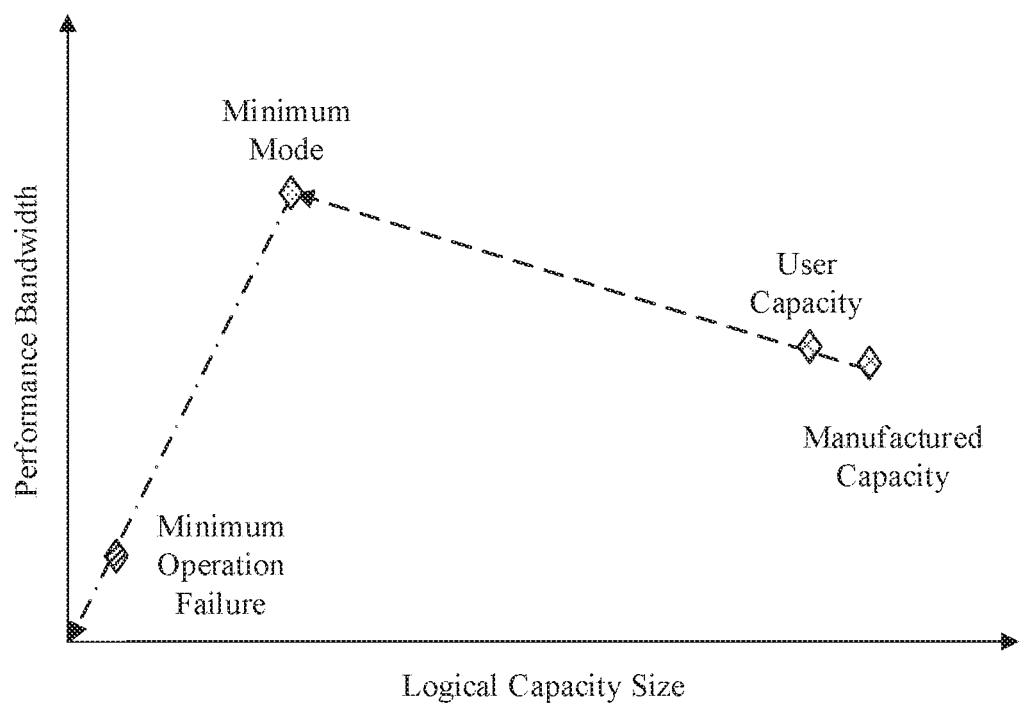
FIG. 10 is an illustrative graph of an example of logical capacity size versus performance bandwidth according to an embodiment.

Turning now to FIG. 10, an illustrative graph of logical capacity size versus performance bandwidth shows how a SSD in accordance with some embodiments may repurpose memory blocks based on a desired configuration, and/or to reclaim defective blocks. The expectation is that as the SSD repurposes the sets of blocks, performance potential will increase as the media operation mode is reduced in density. Repurposing the storage memory to the lower density mode may advantageously extend the timeline to complete failure and the performance may also increase as the drive decreases to the minimum meta operation mode. After the minimum mode is reached, the expectation is that performance and capacity may decrease until minimum operation failure. As the SSD approaches the minimum operation failure point, some embodiments may utilize a SMART command to notify the host of read only mode, wait for all data to be relocated, and then a light emitting diode (LED) may illuminate to indicate the failure sequence for technician replacement.

Figure 11:
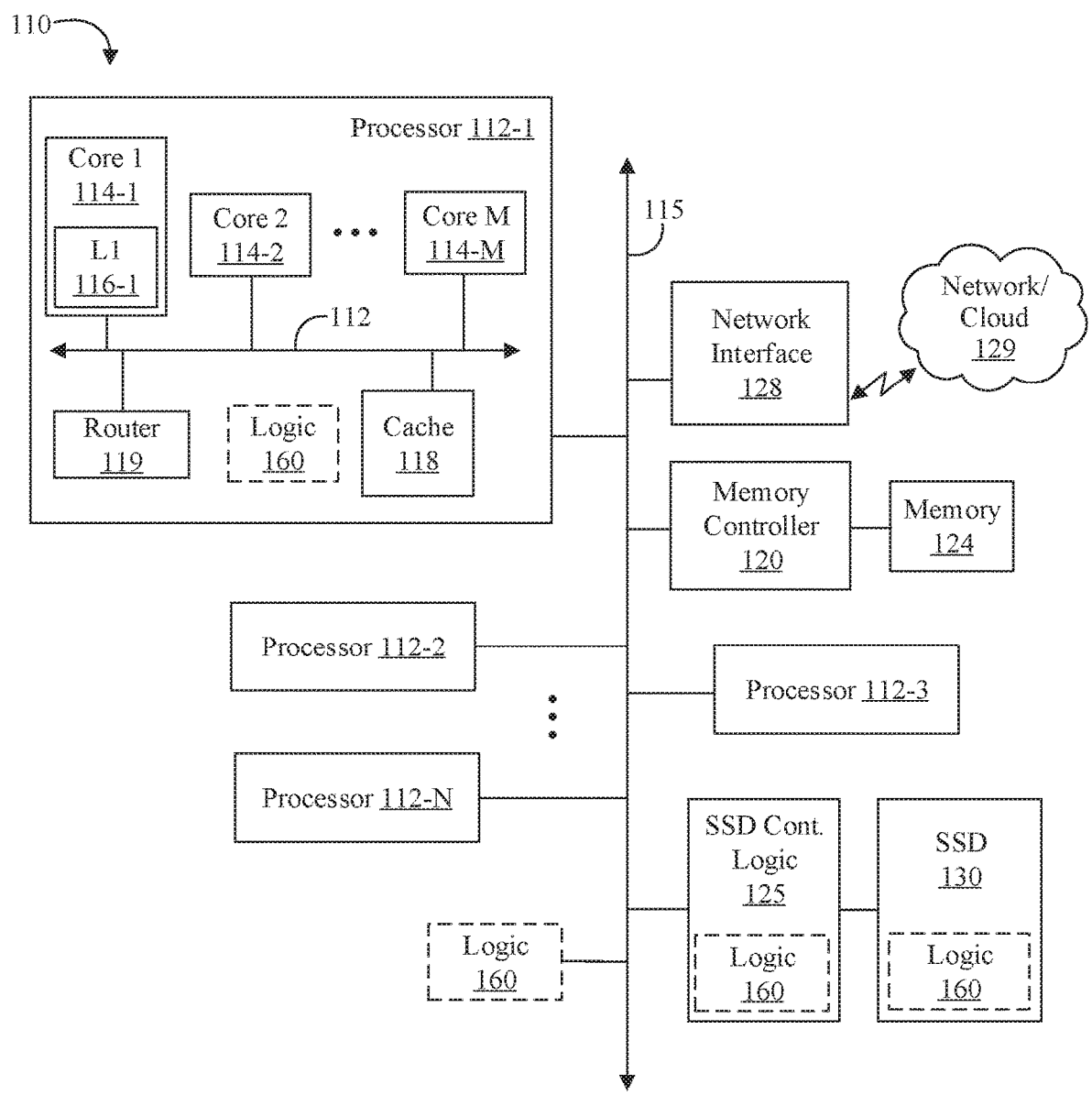
FIG. 11 is a block diagram of an example of a computing system according to an embodiment.

Turning now to FIG. 11, an embodiment of a computing system 110 may include one or more processors 112-1 through 112-N (generally referred to herein as "processors 112" or "processor 112"). The processors 112 may communicate via an interconnection or bus 115. Each processor 112 may include various components some of which are only discussed with reference to processor 112-1 for clarity. Accordingly, each of the remaining processors 112-2 through 112-N may include the same or similar components discussed with reference to the processor 112-1.

In some embodiments, the processor 112-1 may include one or more processor cores 114-1 through 114-M (referred to herein as "cores 114," or more generally as "core 114"), a cache 118 (which may be a shared cache or a private cache in various embodiments), and/or a router 119. The processor cores 114 may be implemented on a single integrated circuit (IC) chip. Moreover, the chip may include one or more shared and/or private caches (such as cache 118), buses or interconnections (such as a bus or interconnection 112), logic 160, memory controllers, or other components.

In some embodiments, the router 119 may be used to communicate between various components of the processor 112-1 and/or system 110. Moreover, the processor 112-1 may include more than one router 119. Furthermore, the multitude of routers 119 may be in communication to enable data routing between various components inside or outside of the processor 112-1.

The cache 118 may store data (e.g., including instructions) that are utilized by one or more components of the processor 112-1, such as the cores 114. For example, the cache 118 may locally cache data stored in a memory 124 for faster access by the components of the processor 112. As shown in FIG. 11, the memory 124 may be in communication with the processors 112 via the interconnection 115. In some embodiments, the cache 118 (that may be shared) may have various levels, for example, the cache 118 may be a mid-level cache and/or a last-level cache (LLC). Also, each of the cores 114 may include a level 1 (L1) cache (116-1) (generally referred to herein as "L1 cache 116"). Various components of the processor 112-1 may communicate with the cache 118 directly, through a bus (e.g., the bus 112), and/or a memory controller or hub.

As shown in FIG. 11, memory 124 may be coupled to other components of system 110 through a memory controller 120. Memory 124 includes volatile memory and may be interchangeably referred to as main memory. Even though the memory controller 120 is shown to be coupled between the interconnection 115 and the memory 124, the memory controller 120 may be located elsewhere in system 110. For example, memory controller 120 or portions of it may be provided within one of the processors 112 in some embodiments.

The system 110 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 110 may also include Non-Volatile (NV) storage device such as a SSD 130 coupled to the interconnect 115 via SSD controller logic 125. Hence, logic 125 may control access by various components of system 110 to the SSD 130. In some embodiments, the SSD 130 may include similar technology as discussed in connection with the SSD 30 (FIG. 3). Furthermore, even though logic 125 is shown to be directly coupled to the interconnection 115 in FIG. 11, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of system 110 (for example where the storage bus is coupled to interconnect 115 via some other logic like a bus bridge, chipset, etc. Additionally, logic 125 may be incorporated into memory controller logic (such as those discussed with reference to FIG. 3) or provided on a same integrated circuit (IC) device in various embodiments (e.g., on the same IC device as the SSD 130 or in the same enclosure as the SSD 130).

Furthermore, logic 125 and/or SSD 130 may be coupled to one or more sensors (not shown) to receive information (e.g., in the form of one or more bits or signals) to indicate the status of or values detected by the one or more sensors. As discussed below, the logic 160 may be configured to identify a defective region of the SSD 130, and switch a sense mode from a first sense mode to a second different sense mode for the defective region to contain less bits per cell. These sensor(s) associated with the first sense mode or the second different sense mode may be provided proximate to components of system 110 (or other computing systems discussed herein such as those discussed with reference to other figures including FIGS. 1-10, for example), including the cores 114, interconnections 115 or 112, components outside of the processor 112, SSD 130, SSD bus, SATA bus, logic 125, logic 160, etc., to sense variations in various factors affecting power/thermal behavior of the system/platform, such as temperature, operating frequency, operating voltage, power consumption, and/or inter-core communication activity, etc. As shown in FIG. 11, features or aspects of the logic 125, and/or the logic 160 may be distributed throughout the system 110, and/or co-located/integrated with various components of the system 110 (including the memory controller 120, network interface 128, cloud 129, etc.).

As illustrated in FIG. 11, the system 110 may include logic 160, some of which may be in the same enclosure as the SSD 130 and/or fully integrated on a printed circuit board (PCB) of the SSD 130. Logic 160 advantageously provides technology to dynamically repurpose memory blocks of the SSD 130. For example, the logic 160 may implement one or more aspects of the method 30 (FIGS. 3A to 3C), and/or the method 90 (FIG. 9). For example, the logic 160 may include technology to receive a request (e.g., from the processors 112, the SSD controller logic 125, the network interface 128, etc.) to modify a configuration of the SSD 130, and to repurpose a region of the SSD 130 from a first number of bits per cell to a second number of bits per cell in response to the request. In some embodiments, the logic 160 may be further configured to change a configuration of the region of the SSD 130 from a higher number of bits per cell to a lower number of bits per cell (e.g., from TLC to MLC or SLC). Additionally, or alternatively, the logic 160 may be configured to identify a defective region of the SSD 130, and switch a sense mode for the defective region to contain less bits per cell. For example, the logic 160 may be configured to determine if the defective region is non-defective with the switched sense mode, and repurpose the defective region as an available region if the defective region is determined to be non-defective with the switched sense mode. In some embodiments, the logic 160 may be further configured to evaluate blocks of the SSD 130 to identify blocks near cell failure, pool one or more sets of blocks identified to be near cell failure based on the number of bits per cell, and repurpose the region of SSD 130 after a set of blocks has pooled a threshold number of blocks. For example, the logic 160 may also be configured to provide estimated performance capability information based on the evaluation to a host (e.g., the processors 112, the SSD controller logic 125, an application, a network agent, etc.), and repurpose the region of persistent storage media based on information received from the host in response to the provided estimated performance capability information. In other embodiments, the SSD 130 may be replaced with any suitable persistent storage technology/media. In some embodiments, the logic 160 may be coupled to one or more substrates (e.g., silicon, sapphire, gallium arsenide, PCB, etc.), and may include transistor channel regions that are positioned within the one or more substrates.

ADDITIONAL NOTES AND EXAMPLES

Example 1 may include a storage system, comprising persistent storage media including multiple bits per cell, a controller communicatively coupled to the persistent storage media, and logic communicatively coupled to the controller and the persistent storage media to receive a request to modify a configuration of the persistent storage media, and repurpose a region of the persistent storage media from a first number of bits per cell to a second number of bits per cell in response to the request.

Example 2 may include the system of Example 1, wherein the logic is further to change a configuration of the region of the persistent storage media from a higher number of bits per cell to a lower number of bits per cell.

Example 3 may include the system of Example 1, wherein the logic is further to identify a defective region of the persistent storage media, and switch a sense mode for the defective region to contain less bits per cell.

Example 4 may include the system of Example 3, wherein the logic is further to determine if the defective region is non-defective with the switched sense mode, and repurpose the defective region as an available region if the defective region is determined to be non-defective with the switched sense mode.

Example 5 may include the system of Example 1, wherein the logic is further to evaluate blocks of the persistent storage media to identify blocks near cell failure, pool one or more sets of blocks identified to be near cell failure based on the number of bits per cell, and repurpose the region of persistent storage media after a set of blocks has pooled a threshold number of blocks.

Example 6 may include the system of Example 5, wherein the logic is further to provide estimated performance capability information based on the evaluation to a host, and repurpose the region of persistent storage media based on information received from the host in response to the provided estimated performance capability information.

Example 7 may include the system of any of Examples 1 to 6, wherein the persistent storage media comprises a solid state drive.

Example 8 may include a semiconductor apparatus, comprising one or more substrates, and logic coupled to the one or more substrates, wherein the logic is at least partly implemented in one or more of configurable logic and fixed-functionality hardware logic, the logic coupled to the one or more substrates to receive a request to modify a configuration of a persistent storage media, and repurpose a region of the persistent storage media from a first number of bits per cell to a second number of bits per cell in response to the request.

Example 9 may include the apparatus of Example 8, wherein the logic is further to change a configuration of the region of the persistent storage media from a higher number of bits per cell to a lower number of bits per cell.

Example 10 may include the apparatus of Example 8, wherein the logic is further to identify a defective region of the persistent storage media, and switch a sense mode for the defective region to contain less bits per cell.

Example 11 may include the apparatus of Example 10, wherein the logic is further to determine if the defective region is non-defective with the switched sense mode, and repurpose the defective region as an available region if the defective region is determined to be non-defective with the switched sense mode.

Example 12 may include the apparatus of Example 8, wherein the logic is further to evaluate blocks of the persistent storage media to identify blocks near cell failure, pool one or more sets of blocks identified to be near cell failure based on the number of bits per cell, and repurpose the region of persistent storage media after a set of blocks has pooled a threshold number of blocks.

Example 13 may include the apparatus of Example 12, wherein the logic is further to provide estimated performance capability information based on the evaluation to a host, and repurpose the region of persistent storage media based on information received from the host in response to the provided estimated performance capability information.

Example 14 may include the apparatus of any of Examples 8 to 13, wherein the persistent storage media comprises a solid state drive.

Example 15 may include the apparatus of any of Examples 8 to 14, wherein the logic coupled to the one or more substrates includes transistor channel regions that are positioned within the one or more substrates.

Example 16 may include a method of managing storage, comprising receiving a request to modify a configuration of a persistent storage media, and repurposing a region of the persistent storage media from a first number of bits per cell to a second number of bits per cell in response to the request.

Example 17 may include the method of Example 16, further comprising changing a configuration of the region of the persistent storage media from a higher number of bits per cell to a lower number of bits per cell.

Example 18 may include the method of Example 16, further comprising identifying a defective region of the persistent storage media, and switching a sense mode for the defective region to contain less bits per cell.

Example 19 may include the method of Example 18, further comprising determining if the defective region is non-defective with the switched sense mode, and repurposing the defective region as an available region if the defective region is determined to be non-defective with the switched sense mode.

Example 20 may include the method of Example 16, further comprising evaluating blocks of the persistent storage media to identify blocks near cell failure, pooling one or more sets of blocks identified to be near cell failure based on the number of bits per cell, and repurposing the region of persistent storage media after a set of blocks has pooled a threshold number of blocks.

Example 21 may include the method of Example 20, further comprising providing estimated performance capability information based on the evaluation to a host, and repurposing the region of persistent storage media based on information received from the host in response to the provided estimated performance capability information.

Example 22 may include the method of any of Examples 16 to 21, wherein the persistent storage media comprises a solid state drive.

Example 23 may include at least one computer readable storage medium, comprising a set of instructions, which when executed by a computing device, cause the computing device to receive a request to modify a configuration of a persistent storage media, and repurpose a region of the persistent storage media from a first number of bits per cell to a second number of bits per cell in response to the request.

Example 24 may include the at least one computer readable storage medium of Example 23, comprising a further set of instructions, which when executed by the computing device, cause the computing device to change a configuration of the region of the persistent storage media from a higher number of bits per cell to a lower number of bits per cell.

Example 25 may include the at least one computer readable storage medium of Example 23, comprising a further set of instructions, which when executed by the computing device, cause the computing device to identify a defective region of the persistent storage media, and switch a sense mode for the defective region to contain less bits per cell.

Example 26 may include the at least one computer readable storage medium of Example 25, comprising a further set of instructions, which when executed by the computing device, cause the computing device to determine if the defective region is non-defective with the switched sense mode, and repurpose the defective region as an available region if the defective region is determined to be non-defective with the switched sense mode.

Example 27 may include the at least one computer readable storage medium of Example 23, comprising a further set of instructions, which when executed by the computing device, cause the computing device to evaluate blocks of the persistent storage media to identify blocks near cell failure, pool one or more sets of blocks identified to be near cell failure based on the number of bits per cell, and repurpose the region of persistent storage media after a set of blocks has pooled a threshold number of blocks.

Example 28 may include the at least one computer readable storage medium of Example 27, comprising a further set of instructions, which when executed by the computing device, cause the computing device to provide estimated performance capability information based on the evaluation to a host, and repurpose the region of persistent storage media based on information received from the host in response to the provided estimated performance capability information.

Example 29 may include the at least one computer readable storage medium of any of Examples 23 to 28, wherein the persistent storage media comprises a solid state drive.

Example 30 may include a storage manager apparatus, comprising means for receiving a request to modify a configuration of a persistent storage media, and means for repurposing a region of the persistent storage media from a first number of bits per cell to a second number of bits per cell in response to the request.

Example 31 may include the apparatus of Example 30, further comprising means for changing a configuration of the region of the persistent storage media from a higher number of bits per cell to a lower number of bits per cell.

Example 32 may include the apparatus of Example 30, further comprising means for identifying a defective region of the persistent storage media, and means for switching a sense mode for the defective region to contain less bits per cell.

Example 33 may include the apparatus of Example 32, further comprising means for determining if the defective region is non-defective with the switched sense mode, and means for repurposing the defective region as an available region if the defective region is determined to be non-defective with the switched sense mode.

Example 34 may include the apparatus of Example 30, further comprising means for evaluating blocks of the persistent storage media to identify blocks near cell failure, means for pooling one or more sets of blocks identified to be near cell failure based on the number of bits per cell, and means for repurposing the region of persistent storage media after a set of blocks has pooled a threshold number of blocks.

Example 35 may include the apparatus of Example 34, further comprising means for providing estimated performance capability information based on the evaluation to a host, and means for repurposing the region of persistent storage media based on information received from the host in response to the provided estimated performance capability information.

Example 36 may include the apparatus of any of Examples 30 to 35, wherein the persistent storage media comprises a solid state drive.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A storage system, comprising:
persistent storage media including multiple bits per cell;
a controller communicatively coupled to the persistent storage media; and
logic communicatively coupled to the controller and the persistent storage media to:
test individual defective blocks of the persistent storage media to identify whether the individual defective blocks support a first number of bits per cell of storage capacity, wherein the test is performed during a read-only mode for the persistent storage media;
provide estimated performance capability information based on the test to a host;
indicate the persistent storage media is ready in response to the provided estimated performance capability information being accepted by the host;
receive a request to modify a configuration of the persistent storage media in response to the provided estimated performance capability information being rejected by the host;
repurpose a region of the persistent storage media from the first number of bits per cell to a second number of bits per cell of storage capacity in response to the request, wherein the region supports the second number of bits per cell of storage capacity based on the test; and
indicate the persistent storage media is ready in response to the repurpose of the region of the persistent storage media, wherein the indication that the persistent storage media is ready is performed after the read-only mode for the persistent storage media.

2. The storage system of claim 1, wherein the logic is further to:
change a configuration of the region of the persistent storage media from a higher number of bits per cell to a lower number of bits per cell.

3. The storage system of claim 1, wherein the logic is further to:
identify one or more of the regions of the persistent storage media that fail to support the first number of bits per cell of storage capacity; and
switch a sense mode for the identified one or more regions to contain less bits per cell.

4. The storage system of claim 3, wherein the logic is further to:
determine if the identified one or more regions support the second number of bits per cell of storage capacity with the switched sense mode; and
repurpose the identified one or more regions as an available region if the identified one or more regions are determined to support the second number of bits per cell of storage capacity with the switched sense mode.

5. The storage system of claim 1, wherein the logic is further to:
pool one or more sets of blocks identified to fail to support the first number of bits per cell of storage capacity; and
repurpose the region of persistent storage media after a set of blocks has pooled a threshold number of blocks.

6. The storage system of claim 1, wherein the persistent storage media comprises a solid state drive.

7. The storage system of claim 1, wherein provision of the estimated performance capability information to the host comprises a notification that the persistent storage media will enter a read only mode via a Self-Monitoring, Analysis, and Reporting Technology feature command.

8. A semiconductor apparatus, comprising:
one or more substrates; and
logic coupled to the one or more substrates, wherein the logic is at least partly implemented in one or more of configurable logic and fixed-functionality hardware logic, the logic coupled to the one or more substrates to:
test individual defective blocks of persistent storage media to identify whether the individual defective blocks support a first number of bits per cell of storage capacity, wherein the test is performed during a read-only mode for the persistent storage media;
provide estimated performance capability information based on the test to a host;
indicate the persistent storage media is ready in response to the provided estimated performance capability information being accepted by the host;

receive a request to modify a configuration of a persistent storage media in response to the provided estimated performance capability information being rejected by the host;

repurpose a region of the persistent storage media from the first number of bits per cell to a second number of bits per cell of storage capacity in response to the request, wherein the region supports the second number of bits per cell of storage capacity based on the test; and indicate the persistent storage media is ready in response to the repurpose of the region of the persistent storage media, wherein the indication that the persistent storage media is ready is performed after the read-only mode for the persistent storage media.

9. The semiconductor apparatus of claim 8, wherein the logic is further to:

change a configuration of the region of the persistent storage media from a higher number of bits per cell to a lower number of bits per cell.

10. The semiconductor apparatus of claim 8, wherein the logic is further to:

identify one or more of the regions of the persistent storage media that fail to support the first number of bits per cell of storage capacity; and switch a sense mode for the identified one or more regions to contain less bits per cell.

11. The semiconductor apparatus of claim 10, wherein the logic is further to:

determine if the identified one or more regions support the second number of bits per cell of storage capacity with the switched sense mode; and repurpose the identified one or more regions as an available region if the identified one or more regions are determined to support the second number of bits per cell of storage capacity with the switched sense mode.

12. The semiconductor apparatus of claim 8, wherein the logic is further to:

pool one or more sets of blocks identified to fail to support the first number of bits per cell of storage capacity; and repurpose the region of persistent storage media after a set of blocks has pooled a threshold number of blocks.

13. The semiconductor apparatus of claim 8, wherein the persistent storage media comprises a solid state drive.

14. The semiconductor apparatus of claim 8, wherein the logic coupled to the one or more substrates includes transistor channel regions that are positioned within the one or more substrates.

15. The semiconductor apparatus of claim 8, wherein provision of the estimated performance capability information to the host comprises a notification that the persistent storage media will enter a read only mode via a Self-Monitoring, Analysis, and Reporting Technology feature command.

16. A method of managing storage, comprising:

testing individual defective blocks of persistent storage media to identify whether the individual defective blocks support a first number of bits per cell of storage capacity, wherein the testing is performed during a read-only mode for the persistent storage media;

providing estimated performance capability information based on the test to a host;

indicating the persistent storage media is ready in response to the provided estimated performance capability information being accepted by the host;

receiving a request to modify a configuration of a persistent storage media in response to the provided estimated performance capability information being rejected by the host;

repurposing a region of the persistent storage media from the first number of bits per cell to a second number of bits per cell of storage capacity in response to the request, wherein the region supports the second number of bits per cell of storage capacity based on the test; and indicating the persistent storage media is ready in response to the repurpose of the region of the persistent storage media, wherein the indication that the persistent storage media is ready is performed after the read-only mode for the persistent storage media.

17. The method of claim 16, further comprising:

changing a configuration of the region of the persistent storage media from a higher number of bits per cell to a lower number of bits per cell.

18. The method of claim 16, further comprising:

identifying one or more of the regions of the persistent storage media that fail to support the first number of bits per cell of storage capacity; and switching a sense mode for the identified one or more regions to contain less bits per cell.

19. The method of claim 18, further comprising:

determining if the identified one or more regions support the second number of bits per cell of storage capacity with the switched sense mode; and repurposing the identified one or more regions as an available region if the identified one or more regions are determined to support the second number of bits per cell of storage capacity with the switched sense mode.

20. The method of claim 16, further comprising:

pooling one or more sets of blocks identified to fail to support the first number of bits per cell of storage capacity; and repurposing the region of persistent storage media after a set of blocks has pooled a threshold number of blocks.

* * * * *